United States Patent [19]

Aslan

[11] 4,431,965

[45] Feb. 14, 1984

[54] MICROWAVE RADIATION MONITOR

[75] Inventor: Edward E. Aslan, Plainview, N.Y.

[73] Assignee: The Narda Microwave Corporation, Hauppauge, N.Y.

[21] Appl. No.: 254,790

[22] Filed: Apr. 16, 1981

[51] Int. Cl.³ .................. G01R 21/10; G01R 19/22; H01Q 1/36
[52] U.S. Cl. ..................................... 324/95; 324/119; 343/703; 343/895
[58] Field of Search ................. 324/95, 72.5, 119; 340/600; 343/703, 760, 895; 455/67

[56] References Cited

U.S. PATENT DOCUMENTS

| 3,783,448 | 1/1974 | Brodwin | 343/703 |
| 4,207,518 | 6/1980 | Hopfer | 324/95 |
| 4,281,287 | 7/1981 | Andrews et al. | 324/95 |
| 4,301,406 | 11/1981 | Shriner | 324/95 |

Primary Examiner—Ernest F. Karlsen
Attorney, Agent, or Firm—Eisenman, Allsopp & Strack

[57] ABSTRACT

This portable microwave radiation monitor utilizes an antenna formed in a dual Archimedean spiral. The power density of the electric field is indicated on a meter coupled to diode means connected across the inner terminals of the antenna by inductance means selected to resonate with the variable capacitance of the diode, substantially at the frequency of the field being monitored.

5 Claims, 4 Drawing Figures

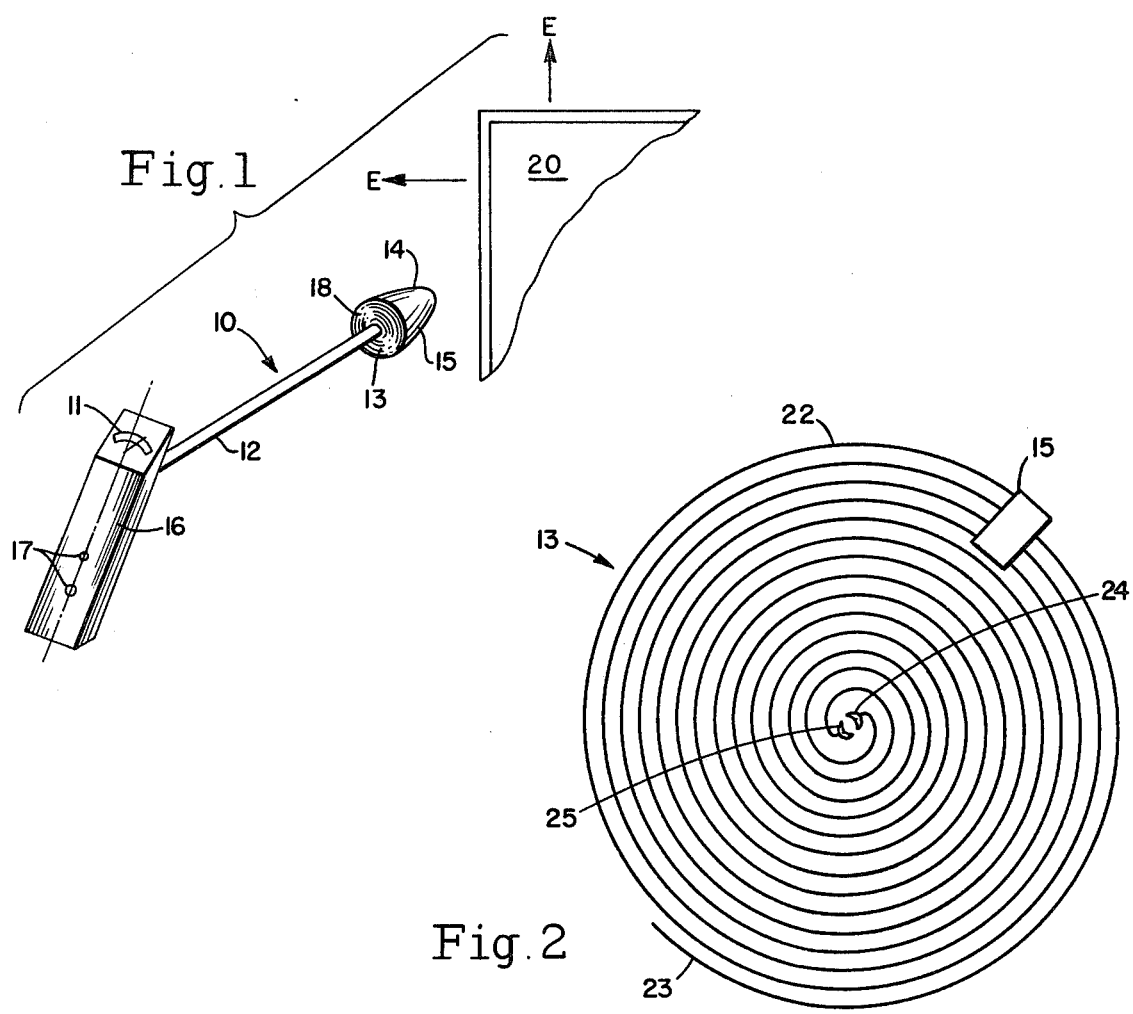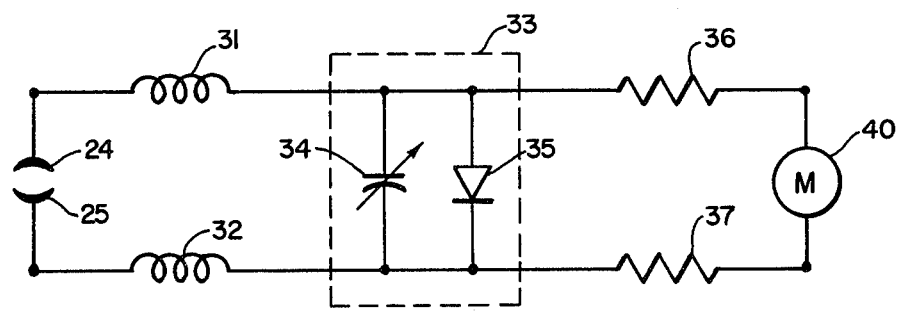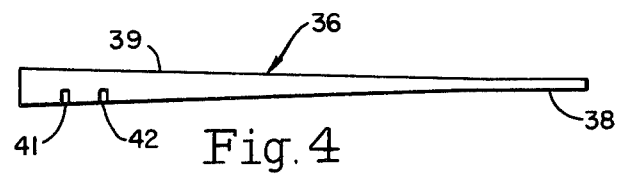

MICROWAVE RADIATION MONITOR

BACKGROUND OF THE INVENTION

1. Field of the Invention

This invention relates to instruments for microwave power monitoring and more particularly, to a portable unit responsive to the power density of a microwave field.

The expanding use of high frequency, or microwave equipment, has brought with it a realization that improper or excess exposure to microwaves, may be injurious. Recognition of this fact has given rise to Government regulations and equipment must be carefully designed to avoid potentially harmful leakage.

Since such electromagnetic radiation is invisible and the human body does not physically "sense" the presence of microwave impingement, it is necessary to use electronic instruments for purposes of detection and measurement. There is a widening need for reliable and economical monitoring instruments that can be properly used, even by inexperienced operators.

2. Description of the Prior Art

Measuring instruments for microwave power have emmerged from earlier devices placed within wave guides, to sophisticated units and components which measure power density when worn or held within the general area of a suspected source of radiation. The inventor's U.S. Pat. No. 3,641,439, which issued Feb. 8, 1972, discloses a pioneer probe for sensitively detecting microwave radiation with a minimum of field perturbation. More economical units have also been developed, with the sacrifice of sensitivity and linearity of measurement. U.S. Pat. No. 4,032,910, for example, discloses a unit utilizing a diode detector and an alarm operative when the energy of an incident microwave field is above a predetermined level. To date, neither the latter unit, nor others, furnish the necessary reliability or sensitivity for compliance with Governmental regulations and recognized health safety standards.

SUMMARY OF THE INVENTION

The present invention is embodied in an inexpensive portable unit which can be easily positioned in proximity to suspected sources of microwave radiation leakage such as microwave ovens, heaters, dryers, medical equipment, and the like.

An object of the invention is to provide a low cost, reliable, portable microwave radiation monitor.

Another object of the invention is to provide a microwave radiation monitor including components which are physically designed and coordinated to maximize monitoring effectiveness.

Another object of the invention is to provide a microwave radiation monitor that will yield a substantially linear response to the power density of the electric field incident thereon.

Still another object of the invention is to provide a portable radiation monitor which can be conveniently tested to insure that it is in working order.

In accordance with one embodiment of the invention, there is provided a microwave radiation monitor comprising an antenna formed in a dual Archimedean spiral wherein the ellipse ratio of the spiral is minimized by selective positioning of resistive means in proximity to a predetermined region of the spiral, wherein adjacent turns have currents of opposite phase when the antenna is oriented in a direction for maximum sensitivity to an electric field. The inner ends of the dual spiral are connected by a Shotkey diode that in turn is connected to a microammeter.

In accordance with another embodiment of the invention, there is provided a microwave radiation monitor comprising an antenna formed in a dual Archimedean spiral and wherein the detecting diode is characterized by a capacitance that decreases with increases in reverse voltage across the diode. Inductive reactance means couple the diode to the inner ends of the antenna spiral and exhibit a reactance to resonate with the diode capacitance when the incident field is of substantially the frequency being monitored.

A more thorough understanding of the invention, along with a better appreciation of the objects and novel features thereof, will be available from the following description which is made in conjunction with the attached drawings.

BRIEF DESCRIPTION OF THE DRAWINGS

FIG. 1 illustrates an instrument embodying the invention, in proximity to a typical source of potentially hazardous microwave radiation;

FIG. 2 is an enlarged layout of an antenna structure for embodying the features of the invention, showing orientation of its individual parts, the connecting terminals, and the location of resistive means for minimizing the ellipse ratio;

FIG. 3 is a circuit schematic of components used in one embodiment of the invention for interconnecting the antenna terminals to an appropriate metering instrument; and FIG. 4 is an illustration of a resistive lead suitable for use in connecting the metering instrument to the detecting components used in various embodiments of the invention.

DESCRIPTION OF THE PREFERRED EMBODIMENT

As seen in FIG. 1, a portable instrument 10, embodying the features of this invention, is shown in relation to the schematic of a microwave oven 20. Typically, the electric field leakage from such a source is either vertically or horizontally oriented, as illustrated by vectors E. To monitor the power density of suspected leakage, instrument 10 is brought into close proximity with the areas of potential radiation.

The instrument 10 comprises a meter 11 interconnected with high resistance leads via a wand 12 to an antenna 13. The antenna is mounted upon the rear planar surface of a spacer element 14 that is composed of polyvinyl chloride or other material having substantially free space characteristics. The antenna is formed within a plane, in a dual Archimedean spiral. Resistive means 15 are positioned selectively over a portion of the spiral, as explained hereinafter, in order to minimize its ellipse ratio.

Meter 11 is mounted upon handle 16 that is rigidly connected to the wand 12. In order to orient the antenna spirals properly for desired sensitivity to an emerging electric field, the major axis of the handle is positioned relative to the location of the resistive means 15 (in this case, approximately at 45°) to effect a sensitivity between the minimum and maximum levels.

The enlarged layout of FIG. 2 represents a seven-turn, two-inch diameter dual spiral forming an antenna that is suitable for measurement of microwave radiation at a frequency of 2,450 MHz. Those skilled in the art are familiar with selection of optimum materials and configurations for various frequencies.

The spiral is an Archimedean spiral defined by:

$$r = a\theta$$

In this equation, r is the radius from the center to a point on the curve of the spiral; a is a constant; and $\theta$ is the angle of rotation in radians. This spiral has a large ellipse ratio due to its small diameter, relative to the wave length being monitored. As an antenna, the spiral's maximum sensitivity to an electric field occurs when an imaginery line connecting the ends of the spiral is aligned with the electric field vector. It has minimum sensitivity when the spiral is rotated 90 degrees from this orientation. When in the maximum sensitivity orientation, the current in the outer turn of the spiral, and in the adjacent turn, is at a maximum at the point on the radius where the electric field vector is tangential to the spiral. Evaluation of the currents in such a spiral reveal that the currents in the outer adjacent turns are in phase. Out-of-phase currents in adjacent turns of the spiral occur where the radius is approximately one-half of the wave length being measured. The segments of the spirals with out-of-phase currents in adjacent turns are essentially fixed in spatial relation to the electric vector of the field being monitored and this pattern remains essentially fixed as the spirals are rotated relative to the electric field vector.

In FIG. 2 the pair of spirals 22,23 terminate in terminals 24,25, respectively. To eliminate or minimize the ellipse effect, a small piece of resistive means 15, which in one embodiment was a carbon-loaded Teflon film, is positioned over the area of high current when the antenna is oriented for maximum sensitivity. This resistive film is insulated from the antenna spiral with a suitable thin intervening dielectric. The width of the resistive material determines the angle over which the reduction in sensitivity is accomplished. The radial length of the resistive material from the periphery toward the center, determines the amount of sensitivity reduction. It is recognized that the width of the material also has some effect on the magnitude of sensitivity reduction.

In a basic instrument, a diode terminates the inner ends of the spirals 22,23. A single Shotkey diode may be used, such that the dc current developed by the diode responsive to an incident field, is carried back by resistive leads to a microampere meter.

FIG. 3 shows a circuit schematic of a further embodiment wherein the antenna terminals 24,25 are connected by an inductance, represented by a short section of parallel wire transmission line 31,32, to a Shotkey diode 33. The terminals of the Shotkey diode are in turn connected by resistive leads 36,37 to a suitable meter 40. The diode is depicted schematically as comprising its equivalent component parts, a variable capacitor 34 which decreases with increase in reverse voltage across the diode, and a diode component 35. It is recognized that such diodes have a square law characteristic, and it is desired to monitor the power density of incident microwaves, as opposed to simply field strength. Since the present instrument does not utilize amplifiers, it does not have available the compensatory effects that may be developed with amplification.

To minimize field perturbation, the high resistive leads 36,37 connect the metering instrument 11 to the diode detector; but, this high resistance necessitates a high detected diode voltage with the resultant linear mode operation. To achieve sufficient output to drive the meter from diode 33, without the use of amplifiers, the diode must be operated in its linear region. If the diode alone is used, and the unit is calibrated in a continuous wave field and then used to monitor a modulated field, an error in the measurement of power density will result. This occurs because the meter current will be proportional to the field strength in volts/meter, whereas it should be proportional to the square of the field strength in volts squared/meter squared, or to the power density which is the desired calibration of the meter.

The error can be reduced substantially by connecting diode 33 to the antenna through an inductive reactance, such as a short section of parallel wire transmission line 31,32. As noted, the capacitance 34 of the diode 33 decreases with the application of increasing reversed voltage. This variation in capacitance is used to tune the resonant circuit comprising the inductance 31,32 and capacitance 34 as the voltage increases, thereby enhancing the increase of voltage across the diode 33. For a particular configuration and frequency of 2,450 MHz, the short section of transmission line was found optimally to be one centimeter long between the diode 33 and antenna terminals 24,25. This provided the necessary inductance to resonate with capacitance 34.

A resistive lead 36 is illustrated in FIG. 4. Appropriate leads may be fabricated from monolithic films of carbon-loaded Teflon. The lead may be tapered along the major portion of its axis 39 and may have a constant-width end 38. The extent of taper is not critical. In one preferred embodiment, the taper extended from a maximum of 0.25 inches to a minimum of 0.025 inches along a length of six inches. The minimum width was then maintained for a length of one inch. The resistive material in this embodiment was 0.002 inches thick and exhibited an impedance of 375 ohms per square. The narrow end of the lead was connected to the transmission line section 31,32 and thence to the antenna terminals 24,25.

Several additional features useful in optimizing the performance of embodiments of this invention, are also worthy of note. Inasmuch as the orientation of the spirals for minimum and maximum sensitivity, is relevant to proper use of this instrument, and these areas of sensitivity differ in orientation by 90 degrees, it has been found desirable to orient the longitudinal axis of the meter generally so that it is 45 degrees with respect to an imaginary line connecting the ends of the spiral. This will tend to make an operator position the instrument for most effective reading. In this position, the meter will provide the average of the min-max sensitivity for either vertical or horizontal polarizations of the incident electric field, and there will be no difference in calibration for either vertically or horizontally polarized fields.

Embodiments of this invention also include a simple, inexpensive, and convenient technique to insure that the meter is in proper working order. Test terminals 17 are provided in the handle 16. These terminals are configured to accept the polarized terminals of a conventional 9-volt transistor radio battery. Within the handle the terminals are connected along one of the resistive leads 36,37, e.g. to conductive strips 41,42 on lead 36, interconnecting the diode 33 with meter 40. Proper polarity is assured by the conventionally polarized large and small terminals. When the battery is inserted in these terminals, current flows through the resistive leads and diode 33, to effect a predetermined test reading on meter 40. If any of the components are broken or operating improperly, the reading will not be normal and it will be clear that the instrument would also function improperly if subjected to a microwave field.

Particular embodiments of the invention have been shown and described. It will be obvious to those skilled in the art that modifications may be made in order to reflect particular conditions and to effect particular measurements. All such modifications as come within the teachings of this disclosure and the scope of the appended claims, are intended to be covered hereby.

What is claimed is:

1. A microwave radiation monitor comprising: a dual Archimedean spiral antenna; a diode characterized by a variable capacitance that decreases as the reverse voltage across said diode increases; inductance means coupling said diode to the inner ends of said spiral antenna, the reactance of said inductance means being selected to substantially resonate with said capacitance when a predetermined frequency is monitored; and a meter connected to measure the current through said diode.

2. A microwave radiation monitor as defined in claim 1, wherein said inductance means is a short section of parallel wire transmission line.

3. A microwave radiation monitor as defined in claim 2 wherein said meter is connected to said diode by high resistance leads.

4. A microwave radiation monitor as defined in claim 3, wherein said high resistance leads are tapered with the narrow end connected to said diode.

5. A microwave radiation monitor as defined in claim 3, including spaced contacts along one of said high resistance leads, and means to connect a properly polarized dc voltage between said contacts to create current flow through said diode, whereby said meter indicates at least a predetermined current level when the components are in working order.

* * * * *